United States Patent
Bakalski et al.

(10) Patent No.: US 10,156,864 B2
(45) Date of Patent: Dec. 18, 2018

(54) INTEGRATED CIRCUIT WITH AN AMPLIFIER MOSFET

(71) Applicant: Infineon Technologies AG, Neubiberg (DE)

(72) Inventors: Winfried Bakalski, Munich (DE);
Werner Simbuerger, Haar (DE);
Anton Steltenpohl, Munich (DE);
Hans Taddiken, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/679,263

(22) Filed: Aug. 17, 2017

(65) Prior Publication Data

US 2018/0052479 A1  Feb. 22, 2018

(30) Foreign Application Priority Data

Aug. 17, 2016  (DE) .................. 10 2016 115 286

(51) Int. Cl.

| | |
|---|---|
| H01L 27/00 | (2006.01) |
| G05F 3/20 | (2006.01) |
| H01L 27/06 | (2006.01) |
| H01L 27/092 | (2006.01) |
| H01L 29/06 | (2006.01) |
| H01L 29/10 | (2006.01) |
| H03G 1/00 | (2006.01) |

(52) U.S. Cl.
CPC .......... *G05F 3/205* (2013.01); *H01L 27/0629* (2013.01); *H01L 27/0922* (2013.01); *H01L 29/0615* (2013.01); *H01L 29/1029* (2013.01); *H03G 1/007* (2013.01); *H03G 1/0023* (2013.01); *H03G 1/0029* (2013.01); *H03G 1/0088* (2013.01)

(58) Field of Classification Search
None
See application file for complete search history.

(56) References Cited

U.S. PATENT DOCUMENTS

| | | | |
|---|---|---|---|
| 5,923,067 A | 7/1999 | Voldman | |
| 6,300,649 B1 | 10/2001 | Hu et al. | |
| 7,961,052 B2 * | 6/2011 | Bacon | H03F 3/195 330/307 |
| 9,178,058 B2 * | 11/2015 | Chen | H01L 29/7833 |
| 9,305,888 B2 * | 4/2016 | Chen | H01L 23/66 |
| 9,755,068 B2 * | 9/2017 | Cho | H01L 29/7816 |
| 9,806,159 B2 * | 10/2017 | Nagy | H01L 29/2003 |
| 2009/0159968 A1 | 6/2009 | Merchant et al. | |
| 2014/0042545 A1 | 2/2014 | Bordelon, Jr. et al. | |

FOREIGN PATENT DOCUMENTS

JP  H09270515 A  10/1997

OTHER PUBLICATIONS

Belostotski, et al., "Sub-0.2 dB Noise Figure Wideband Room-Temperature CMOS LNA With Non-50 Ω Signal-Source Impedance", IEEE Journal of Solid-State Circuits, vol. 42, No. 11, Nov. 2007, pp. 2492-2502.

* cited by examiner

Primary Examiner — Jeffrey Zweizig
(74) Attorney, Agent, or Firm — Slater Matsil, LLP

(57) ABSTRACT

In accordance with an embodiment, an integrated circuit includes a substrate, an amplifier MOSFET, and a bias voltage terminal configured to generate a potential difference of the substrate relative to at least one load terminal of the amplifier MOSFET.

18 Claims, 6 Drawing Sheets

INTEGRATED CIRCUIT WITH AN AMPLIFIER MOSFET

This application claims priority to German patent application No. 102016115286.2, filed on Aug. 17, 2016, which application is hereby incorporated herein by reference in its entirety.

TECHNICAL FIELD

Various embodiments relate to an integrated circuit comprising an amplifier MOSFET and a substrate.

BACKGROUND

The amplification of a signal with low signal noise is desirable in many applications. An amplification with low signal noise may be worthwhile particularly in association with radio-frequency signals. A silicon-germanium (SiGe) technology is often used for implementing corresponding low noise amplifiers (LNA). In this case, transistors using SiGe technology may have a comparatively high threshold voltage (typically 0.7 V) paired with a relatively high current consumption through the base-emitter diode and also temperature dependence (typically 2 mV/K) for switching from a non-conducting state to a conducting state. Moreover, transistors using SiGe technology may have a high robustness vis-à-vis electrostatic discharge.

On the other hand, a complexity in the fabrication of components using SiGe technology may be comparatively high. Furthermore, the linearity and efficiency of switches based on SiGe technology may often be greatly limited. This may be applicable in particular in comparison with complementary metal oxide semiconductor (CMOS) technology. Metal oxide field effect transistors (MOSFETs) are used in CMOS technology.

However, conventional implementations of amplifiers using CMOS technology have disadvantageous properties with regard to signal noise with respect to comparable implementations using silicon-germanium technology. The signal noise may be significant.

SUMMARY

In accordance with one example, an integrated circuit includes a substrate and an amplifier MOSFET. The integrated circuit also includes a bias voltage terminal. The bias voltage terminal is configured to generate a potential difference of the substrate relative to at least one load terminal of the amplifier MOSFET. The resistivity of the substrate is not less than 0.3 kohm cm. The potential difference is −3 V or more negative.

In a further example, a method includes processing a substrate, such that the substrate has a resistivity of not less than 0.3 kohm cm. The method also includes providing an integrated circuit on the substrate, said integrated circuit comprising an amplifier MOSFET and a bias voltage terminal. The bias voltage terminal is configured to generate a potential difference of the substrate relative to at least one load terminal of the amplifier MOSFET, which potential difference is −3 V or more negative.

The features set out above and features described below can be used not only in the corresponding combinations explicitly set out but also in further combinations or in isolation, without departing from the scope of protection of the present invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
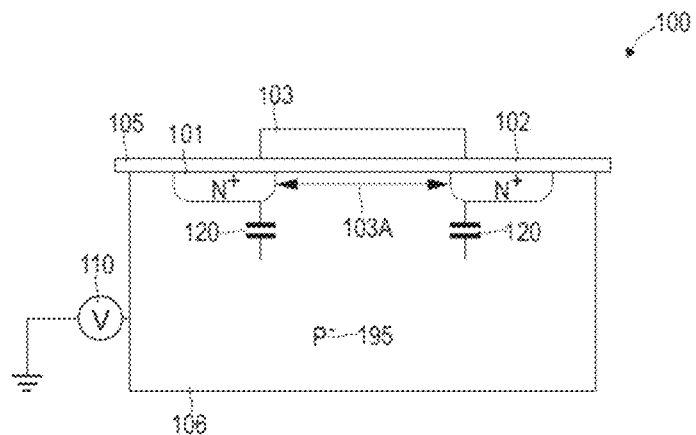
FIG. 1A schematically illustrates an N-channel MOSFET in accordance with various embodiments.

The above-described properties, features and advantages of this invention and the way in which they are achieved will become clearer and more clearly understood in association with the following description of the exemplary embodiments which are explained in greater detail in association with the drawings.

Various embodiments relate to an integrated circuit comprising an amplifier MOSFET and a substrate. In one embodiment, a potential difference of the substrate relative to at least one load terminal of the amplifier MOSFET is −3 V or more negative. The resistivity of the substrate is not less than 0.3 kohm cm.

The present invention is explained in greater detail below on the basis of preferred embodiments with reference to the drawings. In the figures, identical reference signs designate identical or similar elements. The figures are schematic representations of various embodiments of the invention. Elements illustrated in the figures are not necessarily illustrated in a manner true to scale. Rather, the various elements illustrated in the figures are reproduced in such a way that their function and general purpose become understandable to the person skilled in the art. Connections and couplings between functional units and elements as illustrated in the figures can also be implemented as indirect connection or coupling. Functional units can be implemented as hardware, software or a combination of hardware and software.

A description is given below of techniques for providing integrated circuits which are configured to amplify an input signal with a gain factor and to output a corresponding output signal. In this case, a description is given herein of techniques which are suitable in particular for enabling a radio-frequency input signal to be amplified. In this case, signal components of the radio-frequency input signal can have frequencies of >1 GHz, >3 GHz or >10 GHz.

The techniques described herein can provide for example an integrated circuit comprising a MOSFET. The MOSFET typically comprises a control terminal, which is also referred to as gate terminal. The MOSFET typically comprises two load terminals—also referred to as drain terminal and source terminal. In this case, the conductivity between the load terminals is switched by a control voltage at the control terminal. The MOSFET can bring about the amplification of the input signal and can therefore also be referred to as an amplifier MOSFET. In this case, the MOSFET can be fabricated using CMOS technology. This means that the MOSFET for example can be a P-channel MOSFET or alternatively can be an N-channel MOSFET. Silicon, in particular, can be used as substrate. It is not necessary for the MOSFET to be produced using silicon-on-insulator (SOI) technology.

In various examples, the substrate can have a particularly low P-type doping. This can mean that the substrate has a comparatively high resistivity. By way of example, the resistivity of the substrate could be 0.3 kohm cm, or greater.

In further examples, it would be possible for the substrate to have a negative bias voltage relative to a reference potential. By way of example, it would be possible for this potential difference of the substrate relative to the source terminal of the MOSFET to be −3 V or more negative. By way of example, it would also be possible for this potential difference of the substrate relative to the drain terminal of the MOSFET to be −3 V or more negative.

By means of such techniques, parasitic capacitances can be greatly reduced, as a result of which it is possible to achieve additional degrees of freedom with regard to the transistor geometry. It is thus possible to carry out optimization toward particularly low signal noise during the amplification. This can be achieved for example by improving the conductivity of the gate polysilicon in a targeted manner. As a result, it is possible to implement the amplification with a high quality factor. At the same time, it may be possible to implement the integrated circuit using established and readily controlled CMOS technology, in order additionally to utilize the advantages of the logic integration.

The use of a MOSFET may additionally make it possible to provide the amplification with a high linearity.

FIG. 1A illustrates aspects with regard to a MOSFET 100. By way of example, the MOSFET 100 could be used for amplifying an input signal, i.e. as an amplifier MOSFET. In the example in FIG. 1A, the MOSFET 100 is implemented as an N-channel MOSFET (often also referred to as NMOS). This means that between the load terminals 101, 102, as a result of a control voltage being applied to the control terminal 103, a channel with negative charge carriers forms in the otherwise P-doped substrate 106, e.g. silicon. By means of the negative charge carriers, a load current can then flow between the load terminals 101, 102 (conducting state of the MOSFET 100). The control terminal 103 is separated from the substrate 106 by an insulator layer 105.

FIG. 1A furthermore illustrates aspects with regard to a bias voltage between the substrate 106 and a reference potential. FIG. 1A depicts a bias voltage terminal no. The latter is configured to generate a potential difference of the substrate 106 relative to at least one of the load terminals 101, 102—for example relative to the source terminal 101. The potential difference can be defined in this case as: $\Delta U = U_{substrate} - U_{source}$, wherein $U_{Substrate}$ denotes the electrical potential of the substrate and $U_{source}$ denotes the electrical potential of the source terminal 101.

By way of example, the bias voltage terminal no could be embodied as a contact pad, such that an external voltage source can be connected to the integrated circuit 100 in order to generate the potential difference. It would also be possible for the bias voltage terminal no to be connected to a voltage source integrated on the integrated circuit 100, for example a supply terminal. By way of example, the potential difference could be −3 volts or more negative. It would also be possible for the potential difference to be −4 volts or more negative, preferably −6 volts or more negative, particularly preferably −8 volts or more negative.

FIG. 1A furthermore illustrates aspects with regard to the doping of the substrate 106. In the example in FIG. 1A, the substrate 106 has a doping 195 with few acceptors (not illustrated in FIG. 1A). Therefore, the substrate 106 is weakly P-doped. In this case, the doping 195 can be effected such that the substrate 106 has a specific resistivity. By way of example, the resistivity could be 0.3 kohm cm, or greater. It would also be possible for the resistivity to be 0.5 kohm cm, or greater, preferably 1 kohm cm, or greater, particularly preferably 5 kohm cm, or greater.

Figure 1B:
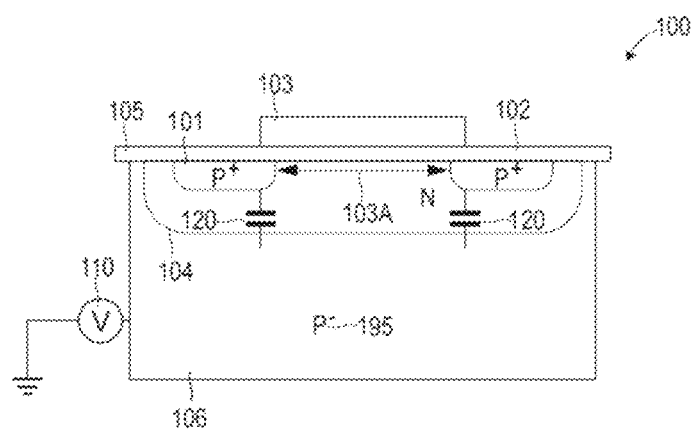
FIG. 1B schematically illustrates a P-channel MOSFET in accordance with various embodiments.

FIG. 1B illustrates aspects with regard to a MOSFET 100. Once again, the MOSFET 100 in accordance with the example in FIG. 1B could be used for amplifying an input signal, i.e. as an amplifier MOSFET. In the example in FIG. 1B, the MOSFET 100 is implemented as a P-channel MOSFET. In this case, the P-channel MOSFET 100 in accordance with the example in FIG. 1B corresponds, in principle, to the N-channel MOSFET 100 in accordance with the example in FIG. 1A. The P-channel MOSFET 100 in accordance with the example in FIG. 1B has an N-doped well 104 surrounding the load terminals 101, 102. Within the N-doped well, a channel with positive charge carriers can then form as a result of a control voltage being applied to the control contact 103.

Furthermore, a gate length 103A of the control terminal 103 is depicted in FIGS. 1A, 1B. The gate length 103A is typically defined by way of the CMOS technology used. Typical gate lengths 103A are for example in the range of 14 nm-1000 nm.

Parasitic capacitances 120 between the load terminals 101, 102 and the substrate 106 are furthermore depicted in FIGS. 1A, 1B. Said capacitances 106 arise on account of a charge carrier depletion in the region of a space charge zone in which a separation of the positive and negative charge carriers takes place. As a result of the weak doping 195, only few free charge carriers are available in the region of the substrate 106. In other words, the comparatively high resistivity of the substrate 106 has the effect that there are few free charge carriers present in the region of the substrate 106. Therefore, a particularly large space charge zone is obtained. Therefore, the capacitances 106 are comparatively low. This results in larger geometries with a lower resistance, which can be used for reducing the signal noise. Moreover, the low capacitance can reduce the requirements made of the radio-frequency matching circuit and enable smaller inductance values, for example: as a result, the losses can also be reduced. The reduction of the losses makes it possible in turn to reduce the signal noise further.

In most examples, the use of an N-channel MOSFET 100 is preferred over the use of a P-channel MOSFET 100 on account of the significantly slower switching times and operating frequencies 106. A P-channel MOSFET typically has a significantly smaller gain.

It may often be desirable to implement a particularly large gate width of the MOSFET 100. In this case, the gate width denotes the extent of the MOSFET 100 perpendicular to the connecting line between the load terminals 101, 102. The gate width can be set for example by parallel connection of a plurality of finger structures each comprising a transistor element of the MOSFET 100. The use of a comparatively large gate width of the MOSFET 100 makes it possible to achieve particularly low signal noise during the amplification. By way of example, it would be possible for the gate width of the MOSFET 100 to be >100 µm, preferably >200 µm, particularly preferably >500 µm. By way of example, the gate width of the MOSFET 100 could be in the range of 280-580 µm.

In this case, various examples described herein are based on the insight that the influence of the capacitances 120 is reduced on account of the high resistivity of the substrate 106. As a result, it may be possible in turn to dimension the gate width of the MOSFET 100 such that it is larger, without attaining unacceptably large absolute values of the capacitances 120. As a result, in turn, it is possible to reduce the channel resistance between the load terminals 101, 102. This in turn brings about low signal noise during the amplification.

A description is given below of various examples with regard to P-channel MOSFETs 100. In this case, however, corresponding techniques could also be implemented with N-channel MOSFETs 100.

Figure 2:
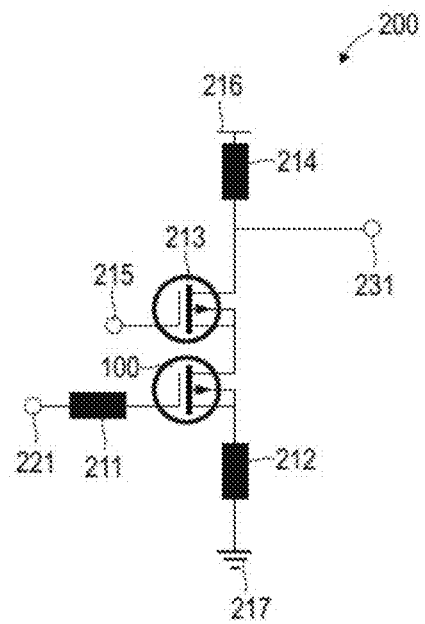
FIG. 2 schematically illustrates an integrated circuit comprising a MOSFET and a cascode MOSFET in accordance with various embodiments.

FIG. 2 illustrates aspects with regard to an integrated circuit 200. The circuit 200 comprises the MOSFET 100 e.g. in accordance with one of the examples from FIGS. 1A, 1B. The MOSFET 100 is connected by its load terminals 101, 102 between a supply terminal 216 and ground 217. A corresponding current flow can be switched between the load terminals of the MOSFET 100 as a function of the input signal at the control terminal 103 of the MOSFET 100. The circuit 200 implements an LNA on the basis of the MOSFET 100. For simplification, FIG. 2 does not show the quiescent current setting (bias) for the MOSFET 100.

The circuit 200 also comprises an input terminal 221 configured to receive an input signal, for example a radio-frequency input signal. The input terminal 221 is connected to the control terminal 103 of the MOSFET 100.

An inductance 211 is arranged adjacent to the input terminal 221. Said inductance brings about a filtering of the input signal. The inductance 211 is dependent on the source impedance and also on the operating frequency and can thus be omitted in some examples.

The circuit 200 also comprises an output terminal 231 configured to output an output signal, for example a radio-frequency output signal. In this case, the output terminal 231 is arranged on a side of the MOSFET 100 which faces the load terminals 101, 102.

In this case, the output signal can correspond to the input signal, but can have a larger amplitude. Such an amplification of the input signal can be obtained by means of the MOSFET 100. The ratio of the amplitude of the output signal to the amplitude of the input signal defines a gain factor. The circuit 200 also comprises an inductance 212. The inductance 212 is arranged on that side of the MOSFET 100 which faces the load terminals 101, 102. The inductance 212 in the example of FIG. 2 is arranged between the source terminal 101 of the MOSFET 100 and ground 217. The MOSFET 100 and the inductance 212 determine the gain factor. By way of example, the gain factor may be 10 dB or greater, preferably 15 dB or greater, particularly preferably 18 dB or greater.

In various examples described herein, the MOSFET 100 is not fabricated using an SOI technology. The load terminals 101, 102 of the MOSFET 100 are thus not separated from the substrate 106 by an insulator layer, i.e. arranged in relation to the substrate 106 using bulk technology. This means that it is possible to implement the potential difference and the resistivity as bulk properties of the circuit 200. This means that the potential difference and the resistivity can be present in the region of the entire circuit 200. A plurality of bias voltage terminals 110 are not required; a single bias voltage terminal 110 can serve the entire circuit 200. In particular, it may be unnecessary to implement the individual transistors of the integrated circuit 200 in each case with individual parameters concerning the doping 195 and the potential difference. A particularly low complexity of the production technology used can be achieved in this way.

The circuit 200 also comprises a cascode MOSFET 213 arranged between the drain terminal 102 of the MOSFET 100 and the output terminal 231. The cascode MOSFET 213 is switched by means of a supply voltage provided via a supply terminal 215 (a circuit for providing the cascode voltage of the cascode MOSFET 213 is not illustrated in FIG. 2, for reasons of clarity). The cascode MOSFET 213 can serve for suppressing the Miller effect.

It is possible for the cascode MOSFET 213 and the MOSFET 100 to be fabricated using the same technology. In particular, the cascode MOSFET 213 and the MOSFET 100 can have identical structural parameters. By way of example, it would be possible for the cascode MOSFET 213 and the MOSFET 100 to have the same gate lengths 103A. Particularly simple fabrication of the circuit 200 can be made possible in this way. In particular, it may be unnecessary to implement the fabrication of the MOSFET 100 and of the cascode MOSFET 213 separately.

The MOSFET 100 and the cascode MOSFET 213 can have the same potential difference between the respective load terminal 101, 102 and the substrate 106. One and the same bias voltage terminal no can be used for this purpose.

In some examples, it would be possible for the cascode MOSFET 213 and the MOSFET 100 to have different gate widths.

An inductance 214 is furthermore provided in order to increase an impedance in the direction of the supply terminal 216 for the radio-frequency output signal.

Figure 3:
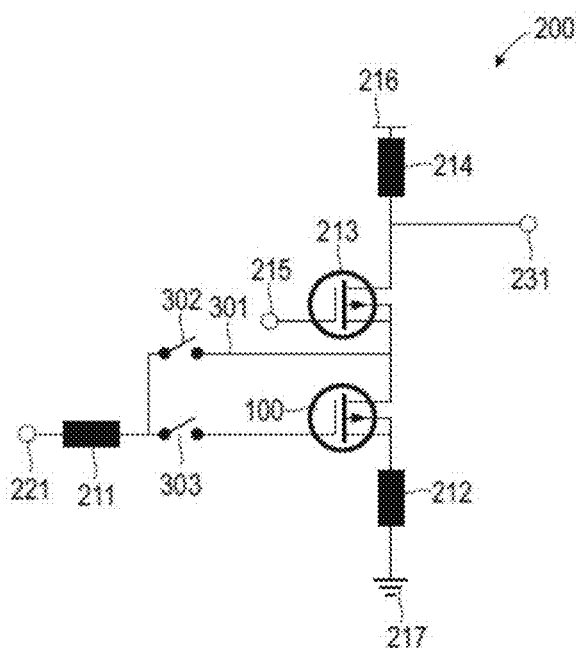
FIG. 3 schematically illustrates an integrated circuit comprising a MOSFET and a bypass branch in accordance with various embodiments.

FIG. 3 illustrates aspects with regard to an integrated circuit 200. The circuit 200 comprises the MOSFET 100 e.g. in accordance with one of the examples in FIGS. 1A, 1B. In this case, the circuit 200 in accordance with the example in FIG. 3 corresponds, in principle, to the circuit 200 in accordance with the example in FIG. 2. In particular, various aspects described above with regard to the circuit 200 in accordance with the example in FIG. 2 can also be applied to the circuit 200 in accordance with the example in FIG. 3. The circuit 200 implements an LNA on the basis of the MOSFET 100.

In the example in FIG. 3, the circuit 200 comprises two switches 302, 303. In this case, the switches 302, 303 are arranged adjacent to the input terminal 221. The switch 302 is arranged between the input terminal 221 and the control terminal 103 of the MOSFET 100. The switch 302 is arranged in a bypass branch 301, which connects the input terminal 221 to the output terminal 231 whilst bypassing the MOSFET 100.

Depending on the amplitude of the input signal at the input terminal 221, it would be possible optionally to activate the bypass branch 301 by corresponding actuation of the switches 302, 303, such that the amplification of the input signal can be effected or the amplification can be suppressed. As a result—e.g. also with regard to power amplifiers—with a sufficiently large amplitude of the input signal it is possible to reduce the energy consumption by bypassing the MOSFET 100. Furthermore, the input-side compression/saturation of the MOSFET 100 can be avoided.

Figure 4:
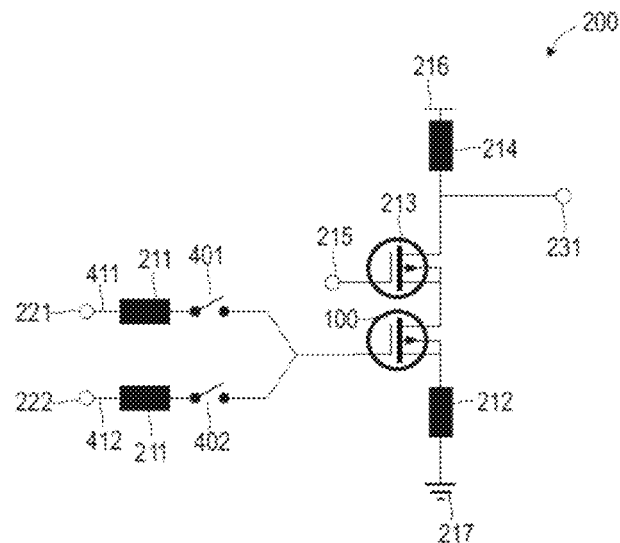
FIG. 4 schematically illustrates an integrated circuit comprising a MOSFET, a plurality of input terminals, and also a plurality of switches assigned to the input terminals, in accordance with various embodiments.

FIG. 4 illustrates aspects with regard to an integrated circuit 200. The circuit 200 comprises the MOSFET 100 e.g. in accordance with one of the examples in FIGS. 1A, 1B. In this case, the circuit 200 in accordance with the example in FIG. 4 corresponds, in principle, to the circuit 200 in accordance with the example in FIGS. 2 and 3. In particular, various aspects described above with regard to the circuit 200 in accordance with the example in FIGS. 2 and 3 can also be applied to the circuit 200 in accordance with the example in FIG. 4. The circuit 200 implements an LNA on the basis of the MOSFET 100.

In the example in FIG. 4, the circuit 200 comprises a plurality of switches 401, 402 and a plurality of input terminals 221, 222. In this case, the switches 401, 402 are respectively associated with one of the input terminals 221, 222. By way of example, the switch 401 is arranged adjacent to the input terminal 221. The switch 401 is arranged in particular between the control terminal 103 of the MOSFET 100 and the input terminal 221. The switch 402 is in turn arranged adjacent to the input terminal 222. The switch 402 is arranged in particular between the control terminal 103 of the MOSFET 100 and the input terminal 222.

By means of corresponding actuation of the switches 401, 402, it may be possible to select between different input signals at the input terminals 221, 222 for amplification by means of the MOSFET 100.

Figure 5:
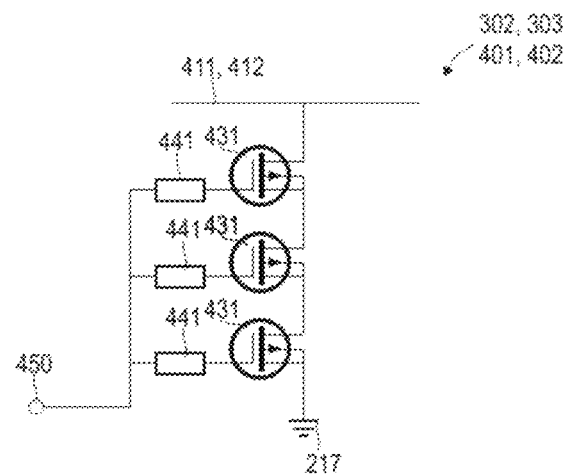
FIG. 5 schematically illustrates the switches from FIG. 4 in greater detail in accordance with various embodiments.

FIG. 5 illustrates details concerning the switches 302, 303, 401, 402. Here, the switches 302, 303, 401, 402 are implemented in each case by a series connection of switch MOSFETs toward ground 217. The switch MOSFETs can have the same gate length 103A as the MOSFET 100. Particularly simple fabrication of the circuit 200 can once again be made possible in this way. In particular, it may be unnecessary to implement the fabrication of the MOSFET 100 and of the switch MOSFETs separately.

In the example in FIG. 5, the respective switch 302, 303, 401, 402 is implemented by a plurality of switch MOSFETs 431 with an associated control resistor 441 and supply terminal 450. What can be achieved by such stacking of switch MOSFETs 431 is that the comparatively low breakdown voltage of the individual switch MOSFETs 431 is compensated for by uniform distribution of the voltage drop across the various switch MOSFETs 431 of the stack.

The MOSFET 100 and the switch MOSFETs 431 can have the same potential difference between the respective load terminal 101, 102 and the substrate 106. One and the same bias voltage terminal no can be used for this purpose. The negative bias voltage of the substrate 106 makes it possible to reduce parasitic substrate diodes of the switch MOSFETs 431. As a result, it is possible to achieve a particularly linear voltage distribution for the "OFF" state within the stack 431 for the switches 302, 303, 401, 402.

Figure 6:
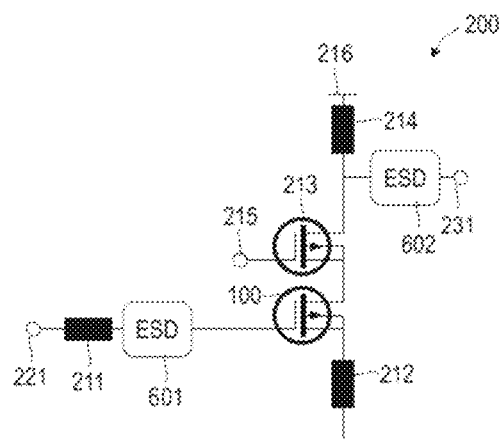
FIG. 6 schematically illustrates an integrated circuit comprising a MOSFET and overvoltage protection elements in accordance with various embodiments.

FIG. 6 illustrates aspects with regard to an integrated circuit 200. The circuit 200 comprises the MOSFET 100 e.g. in accordance with one of the examples in FIGS. 1A, 1B. In this case, the circuit 200 in accordance with the example in FIG. 6 corresponds, in principle, to the circuit 200 in accordance with the example in FIGS. 2-4. In particular, various aspects described above with regard to the circuit 200 in accordance with the example in FIGS. 2-4 can also be applied to the circuit 200 in accordance with the example in FIG. 6. The circuit 200 implements an LNA on the basis of the MOSFET 100.

The circuit 200 in the example in FIG. 6 furthermore comprises an overvoltage protection element 601 arranged between the input terminal 221 and the MOSFET 100. The overvoltage protection element 601 is thus arranged on a side of the MOSFET 100 facing the control terminal 101 of the MOSFET 100. The overvoltage protection element 601 is arranged between the input terminal 221 and the control terminal 101 of the MOSFET 100. The overvoltage protection element 601 can be configured to dissipate overvoltages of the input signal—for example on account of electrostatic discharges during the manual handling of the circuit 200—to ground 217. Damage to the MOSFET 100 can be avoided in this way.

The circuit 200 in the example in FIG. 6 furthermore comprises an overvoltage protection element 602 arranged between the output terminal 231 and the MOSFET 100. The overvoltage protection element 602 is thus arranged on a side of the MOSFET 100 facing the load terminals 101, 102 of the MOSFET 100. In particular, the overvoltage protection element 602 is arranged between the drain terminal 102 of the MOSFET 100 and the output terminal 231.

Figure 7:
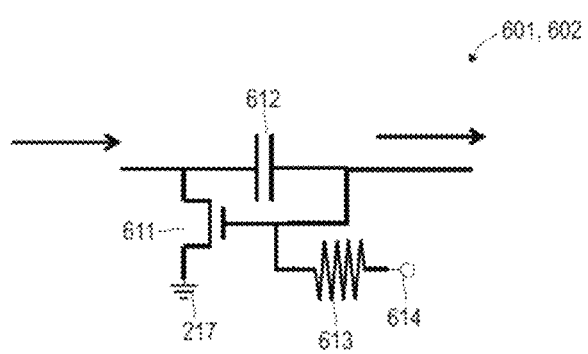
FIG. 7 schematically illustrates the overvoltage protection elements from FIG. 6 in greater detail in accordance with various embodiments.

FIG. 7 illustrates aspects with regard to the overvoltage protection elements 601, 602. In particular, FIG. 7 illustrates the overvoltage protection elements 601, 602 in accordance with an exemplary implementation in greater detail.

The overvoltage protection elements 601, 602 comprise a capacitor 612, an ESD MOSFET 611, a resistor 613, and also a supply terminal 614. In the example in FIG. 7, the overvoltage protection elements 601, 602 comprise only a single ESD MOSFET 611. In other examples, however, it would also be possible for the overvoltage protection elements 601, 602 to comprise a series connection of a plurality of ESD MOSFETs 611—comparable with the implementation of the switches 202, 303, 401, 402 in accordance with the example in FIG. 5.

It is possible for the at least one ESD MOSFET 611 to have the same gate length 103A as the MOSFET 100. Particularly simple fabrication of the circuit 200 can once again be made possible in this way. In particular, it may be unnecessary to implement the fabrication of the MOSFET 100 and of the ESD MOSFET 611 separately.

In some examples, it would be possible for the functionality of the switches 302, 303, 411, 412 and the functionality of the overvoltage protection elements 601, 602 to be implemented by mutually corresponding structures comprising stacked MOSFETs 431, 611. In such examples, it may be possible that for example the overvoltage protection element 601 arranged adjacent to the input terminal 221 is implemented by the corresponding switch 303. A particularly high integration of the circuit 200 can be achieved as a result.

The MOSFET 100 and the at least one ESD MOSFET 611 can have the same potential difference between the respective load terminal 101, 102 and the substrate 106. One and the same bias voltage terminal 110 can be used for this purpose.

Figure 8:
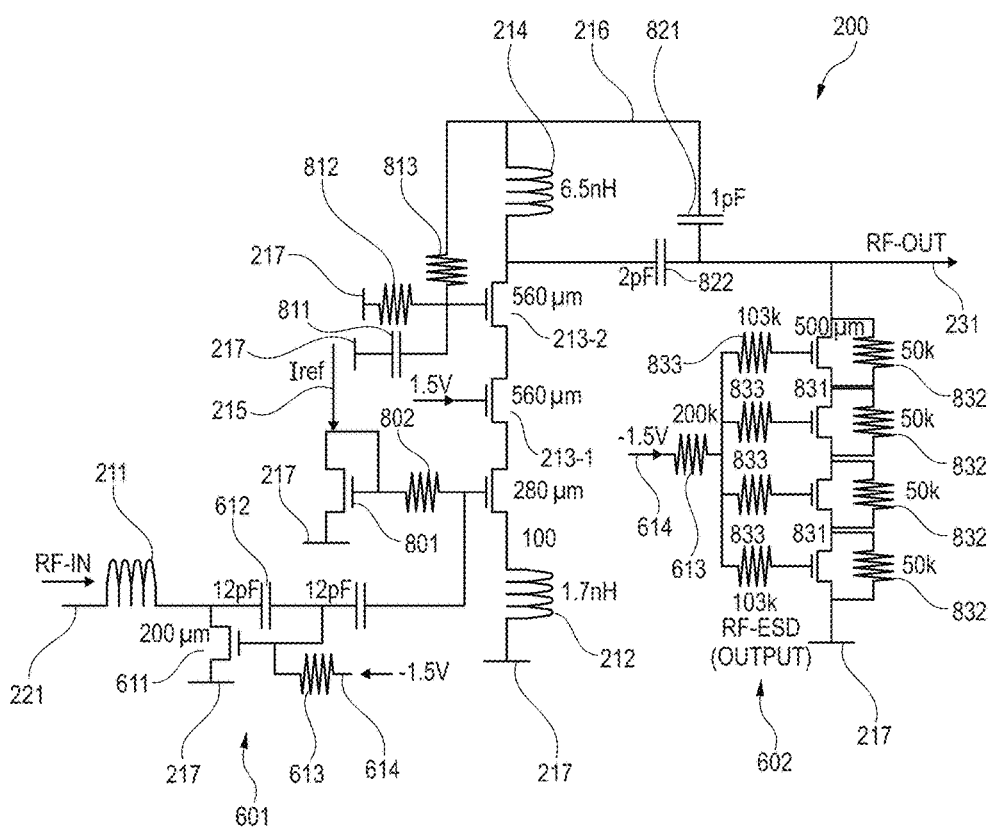
FIG. 8 schematically illustrates an integrated circuit comprising a MOSFET in accordance with various embodiments.

FIG. 8 illustrates aspects with regard to an integrated circuit 200. The circuit 200 comprises the MOSFET 100 e.g. in accordance with one of the examples in FIGS. 1A, 1B. In this case, the circuit 200 in accordance with the example in FIG. 8 corresponds, in principle, to the circuit 200 in accordance with the example in FIGS. 2-4 and 6. In particular, various aspects described above with regard to the circuit 200 in accordance with the example in FIGS. 2-4 and 6 can also be applied to the circuit 200 in accordance with the example in FIG. 8. The circuit 200 implements an LNA on the basis of the MOSFET 100.

The example of the circuit 200 in accordance with FIG. 8 once again comprises overvoltage protection elements 601, 602, which are respectively arranged adjacent to the input terminal 221 and to the output terminal 231. The overvoltage protection element 602 in this case comprises a series connection of ESD MOSFETs 831 with corresponding gate resistors 613, 833. Moreover, resistors 832 are connected in parallel with the load terminals 101, 102 of the ESD MOSFETs 832. These serve for setting a quiescent potential, such that the ESD MOSFET 831 can be switched in a defined manner. The MOSFET 100 and the ESD MOSFETs 832 can have the same potential difference between the respective load terminal 101, 102 and the substrate 106. One and the same bias voltage terminal no can be used for this purpose.

The circuit 200 comprises two cascode MOSFETs 213-1, 213-2. In this case, the cascode MOSFET 213-2 is driven via a voltage divider 811, 812, 813.

The capacitors 821, 822 are arranged adjacent to the output terminal 231.

A current mirror 801, 802 is provided for driving the MOSFET 100, said current mirror providing a current 215 for charge reversal of the control terminal 101 of the MOSFET 100.

The circuit 200 having amplifier functionality in accordance with the various examples described herein could be used in different applications. By way of example, the input terminal 221 could be connected to one or a plurality of antennas of, for instance, a mobile radio device.

Figure 9:
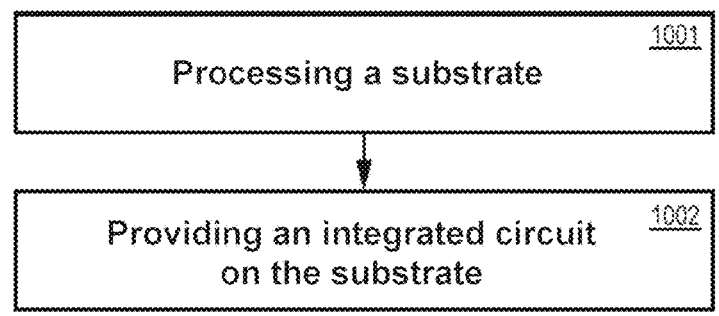
FIG. 9 is a flow diagram of a method in accordance with various embodiments.

FIG. 9 is a flow diagram of a method in accordance with various embodiments. In block low, a substrate is processed. By way of example, a doping of the substrate can contribute to this. The substrate is processed in such a way that it has a resistivity of not less than 0.3 kohm cm.

Block 1002 involves providing an integrated circuit on the substrate. Block 1002 can comprise one or a plurality of lithography steps. The lithography steps can comprise for example coating the substrate with a photoresist, exposing the photoresist, developing the photoresist, depositing material and removing the photoresist. Block 1002 could also comprise one or a plurality of etching steps.

By way of example, providing the integrated circuit in block 1002 can be effected in accordance with CMOS technology. In particular, it would be possible for the integrated circuit to comprise an amplifier MOSFET and a bias voltage terminal. The bias voltage terminal can be configured to generate a potential difference of the substrate relative to at least one load terminal of the amplifier MOSFET. The potential difference can be for example −3 V, or more negative.

Various effects can thus be achieved by means of the techniques described herein.

As a first effect, it is possible to reduce the capacitances between the load terminals and the substrate of a MOSFET on account of the low conductivity or the high resistivity of the substrate. The signal noise of the amplification can be reduced as a result. By way of example, by means of the techniques described herein, it is possible to obtain amplifiers having a signal noise of the order of magnitude of 0.2-1.2 dB as minimum achievable signal noise for a given gain factor and a specific frequency.

As a second effect, as a result of the negative bias voltage of the substrate the parasitic substrate diodes can be reduced. As a result, it is possible to achieve a particularly good linearity for switches which are implemented by a series connection of switch MOSFETs.

As a third effect, on account of small dimensioned capacitances with respect to the substrate undesired modes in the case of radio-frequency signals even in the case of passive components such as capacitors or coils, for example, can be arranged outside the relevant spectrum.

It goes without saying that the features of the above-described embodiments and aspects of the invention can be combined with one another. In particular, the features can be used not only in the combinations described, but also in other combinations or by themselves, without departing from the field of the invention.

While exemplary circuits and switching elements in association with LNAs were primarily described above, it would also be possible to apply corresponding techniques to power amplifiers. High current flows in the range of >200 mA, or >1 A, or >50 A are typically switched in the case of power amplifiers.

The following examples are preferred embodiments of the invention.

Example 1

An integrated circuit (200) comprising: a substrate (106), an amplifier MOSFET (100), and a bias voltage terminal (110), which is configured to generate a potential difference of the substrate (106) relative to at least one load terminal (101, 102) of the amplifier MOSFET (100), where the resistivity of the substrate (106) is not less than 0.3 kohm cm, and where the potential difference is −3 volts or more negative.

Example 2

The integrated circuit (200) of example 1, where the gate width of the amplifier MOSFET (100) is greater than 100 μm, optionally greater than 200 μm, further optionally greater than 500 μm.

Example 3

The integrated circuit (200) of example 1 or 2, where the resistivity and the potential difference are bulk properties of the substrate (106) in the region of the integrated circuit (200).

Example 4

The integrated circuit (200) of any of the preceding examples, which furthermore includes: at least one input terminal (221, 222) which is connected to a control terminal (103) of the amplifier MOSFET (100) and which is configured to receive at least one input signal, and an output terminal (231), which is arranged on a side facing the at least one load terminal (101, 102) of the amplifier MOSFET (100) and which is configured to output an output signal.

Example 5

The integrated circuit (200) of example 4, which furthermore includes: an inductance (212) arranged on the side facing the load terminal (101, 102) of the amplifier MOSFET (100), where the amplifier MOSFET (100) and the inductance (212) are configured to implement a gain factor of the output signal relative to the at least one input signal of not less than 10 dB, preferably of not less than 15 dB, particularly preferably of not less than 18 dB.

Example 6

The integrated circuit (200) of example 4 or 5, which furthermore includes: at least one cascode MOSFET (213, 213-1, 213-2) which is arranged between the at least one load terminal (101, 102) of the amplifier MOSFET (100) and the output terminal (231), where the at least one cascode MOSFET (213, 213-1, 213-2) and the amplifier MOSFET (100) have the same gate length (103A).

Example 7

The integrated circuit (200) of any of examples 4-6, which furthermore includes: at least one switch (302, 303, 401, 402) which is arranged adjacent to the at least one input terminal (221, 222) and which has a series connection of switch MOSFETs (431) toward ground (217), where the switch MOSFETs (431) and the amplifier MOSFET (100) have the same gate length (103A).

Example 8

The integrated circuit (200) of example 7, where the at least one switch (302, 303, 401, 402) is arranged in a bypass branch (301), which connects the at least one input terminal (221, 222) to the output terminal (231) whilst bypassing the amplifier MOSFET (100).

Example 9

The integrated circuit (200) of example 7 or 8, where the integrated circuit (200) includes a plurality of switches (302, 303, 401, 402) and a plurality of input terminals (221, 222), where at least some of the plurality of switches (302, 303, 401, 402) are associated in each case with a corresponding one of the plurality of input terminals (221, 222).

Example 10

The integrated circuit (200) of any of the preceding examples, which furthermore includes: at least one overvoltage protection element (601, 602) having at least one ESD MOSFET (611, 831), where the at least one ESD MOSFET (611, 831) and the amplifier MOSFET (100) have the same gate length (103A).

Example 11

The integrated circuit (200) of any of examples 4-9, and of example 10, where the at least one overvoltage protection element (601, 602) is arranged between the at least one input terminal (221, 222) and the control terminal (103) of the amplifier MOSFET (100), and/or where the at least one overvoltage protection element (601, 602) is arranged between the at least one load terminal (101, 102) of the amplifier MOSFET (100) and the output terminal (231).

Example 12

The integrated circuit (200) of any of examples 7-9, and of example 10 or 11, where the at least one overvoltage protection element (601, 602) is implemented by the at least one switch (302, 303, 401, 402).

Example 13

The integrated circuit (200) of any of the preceding examples, where the resistivity of the substrate (106) is not less than 0.5 kohm cm, preferably not less than 1 kohm cm, particularly preferably not less than 5 kohm cm.

Example 14

The integrated circuit (200) of any of the preceding examples, where the potential difference is −4 volts or more negative, preferably −6 volts or more negative, particularly preferably −8 volts or more negative.

Example 15

The integrated circuit of any of the preceding examples, where the at least one load terminal (101, 102) of the amplifier MOSFET (100) is arranged using bulk technology in relation to the substrate (106).

Example 16

The integrated circuit of any of the preceding examples, where the substrate (106) is silicon.

Example 17

The integrated circuit of any of the preceding examples, where the amplifier MOSFET (100) implements a low noise amplifier or a power amplifier.

Example 18

An analog output stage of a radio-frequency transceiver, comprising: an antenna, and the integrated circuit (200) of any of the preceding examples, where the antenna is connected to an input terminal (221, 222) of the integrated circuit (200).

Example 19

A method comprising: processing a substrate (106), such that the latter has a resistivity of not less than 0.3 kohm cm, and providing an integrated circuit (200) on the substrate (106), said integrated circuit comprising an amplifier MOSFET (100) and a bias voltage terminal (110), where the bias voltage terminal (110) is configured to generate a potential difference of the substrate (106) relative to at least one load terminal (101, 102) of the amplifier MOSFET (100), which potential difference is −3 volts or more negative.

Example 20

The method of example 19, where the method is used for producing an integrated circuit (200) of any of examples 1-17.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a substrate;
   an amplifier MOSFET; and
   a bias voltage terminal configured to generate a potential difference of the substrate relative to at least one load terminal of the amplifier MOSFET, wherein a resistivity of the substrate is not less than 0.3 kohm cm, and the potential difference is −3 volts or more negative.

2. The integrated circuit as claimed in claim 1, wherein a gate width of the amplifier MOSFET is greater than 100 µm.

3. The integrated circuit as claimed in claim 1, wherein the resistivity and the potential difference are bulk properties of the substrate in a region of the integrated circuit.

4. The integrated circuit as claimed in claim 1, further comprising:
   at least one input terminal which is connected to a control terminal of the amplifier MOSFET and which is configured to receive at least one input signal, and
   an output terminal, which is arranged on a side facing the at least one load terminal of the amplifier MOSFET and which is configured to output an output signal.

5. The integrated circuit as claimed in claim 4, further comprising: an inductance arranged on the side facing the load terminal of the amplifier MOSFET, wherein the amplifier MOSFET and the inductance are configured to implement a gain factor of the output signal relative to the at least one input signal of not less than 10 dB.

6. The integrated circuit as claimed in claim 4, further comprising at least one cascode MOSFET arranged between the at least one load terminal of the amplifier MOSFET and the output terminal, wherein the at least one cascode MOSFET and the amplifier MOSFET have a same gate length.

7. The integrated circuit as claimed in claim 4, further comprising at least one switch arranged adjacent to the at least one input terminal, the at least one switch comprising a series connection of switch MOSFETs coupled to a ground connection, wherein the switch MOSFETs and the amplifier MOSFET have a same gate length.

8. The integrated circuit as claimed in claim 7, wherein the at least one switch is arranged in a bypass branch, wherein the bypass branch connects the at least one input terminal to the output terminal whilst bypassing the amplifier MOSFET.

9. The integrated circuit as claimed in claim 7,
   wherein the integrated circuit comprises a plurality of switches and a plurality of input terminals, and
   wherein at least some of the plurality of switches are associated in each case with a corresponding one of the plurality of input terminals.

10. The integrated circuit as claimed in claim 7, further comprising at least one overvoltage protection element having at least one ESD MOSFET, wherein the at least one ESD MOSFET and the amplifier MOSFET have a same gate length, wherein the at least one overvoltage protection element is implemented by the at least one switch.

11. The integrated circuit as claimed in claim 7, further comprising at least one overvoltage protection element having at least one ESD MOSFET,
    wherein the at least one overvoltage protection element is arranged between the at least one load terminal of the amplifier MOSFET and the output terminal.

12. The integrated circuit as claimed in claim 1, wherein the resistivity of the substrate is not less than 0.5 kohm cm.

13. The integrated circuit as claimed in claim 1, wherein the potential difference is −4 volts or more negative.

14. The integrated circuit as claimed in claim 1, wherein the at least one load terminal of the amplifier MOSFET is arranged using bulk technology in relation to the substrate.

15. The integrated circuit as claimed in claim 1, wherein the substrate is a silicon substrate.

16. The integrated circuit as claimed in claim 1, wherein the amplifier MOSFET implements a low noise amplifier or a power amplifier.

17. An analog output stage of a radio-frequency transceiver, comprising:
    an antenna, and
    an integrated circuit comprising
       a substrate,
       an amplifier MOSFET, and
       a bias voltage terminal configured to generate a potential difference of the substrate relative to at least one load terminal of the amplifier MOSFET, wherein a resistivity of the substrate is not less than 0.3 kohm cm, and the potential difference is 3 volts or more negative, wherein the antenna is connected to an input terminal of the integrated circuit.

18. A method comprising:
    processing a substrate having a resistivity of not less than 0.3 kohm cm; and
    providing an integrated circuit on the substrate, said integrated circuit comprising an amplifier MOSFET and a bias voltage terminal, wherein the bias voltage terminal is configured to generate a potential difference of the substrate relative to at least one load terminal of the amplifier MOSFET, which potential difference is −3 volts or more negative.

* * * * *